US007071624B2

(12) United States Patent
Tsuchida

(10) Patent No.: US 7,071,624 B2
(45) Date of Patent: Jul. 4, 2006

(54) MICROWAVE TUBE SYSTEM AND MICROWAVE TUBE

(75) Inventor: Hiroshi Tsuchida, Sagamihara (JP)

(73) Assignee: NEC Microwave Tube, Ltd., Kanagawa (JP)

( * ) Notice: Subject to any disclaimer, the term of this patent is extended or adjusted under 35 U.S.C. 154(b) by 0 days.

(21) Appl. No.: 10/958,255

(22) Filed: Oct. 6, 2004

(65) Prior Publication Data

US 2005/0077831 A1 Apr. 14, 2005

(30) Foreign Application Priority Data

Oct. 8, 2003 (JP) ............................ 2003-349350

(51) Int. Cl.
*H01J 25/34* (2006.01)
*H03F 3/58* (2006.01)

(52) U.S. Cl. ......................................... 315/3.5; 330/43

(58) Field of Classification Search ................. 315/3.5, 315/3.6, 5.13; 330/42–45, 47, 127, 129
See application file for complete search history.

(56) References Cited

U.S. PATENT DOCUMENTS 3,760,223 A * 9/1973 Jasper, Jr. .................... 315/3.6
3,780,252 A * 12/1973 Crapuchettes ............... 219/716
6,777,876 B1 * 8/2004 Kobayashi et al. .......... 315/3.5
6,909,235 B1 * 6/2005 Wolkstein et al. ........... 315/3.5

FOREIGN PATENT DOCUMENTS

| | | |
|---|---|---|
| JP | 61-157251 | 9/1986 |
| JP | 2-110944 | 9/1990 |
| JP | 4-301342 | 10/1992 |
| JP | 5-347128 | 12/1993 |

* cited by examiner

*Primary Examiner*—Minh Dieu A
(74) *Attorney, Agent, or Firm*—Young & Thompson

(57) ABSTRACT

A microwave tube has a configuration in which the connection between an anode electrode and the helix is cut, the helix is grounded, and a current suppression element is provided between the anode electrode and ground voltage for suppressing the continuous time interval of the flow of an excess current to the helix that is caused by discharge to a time interval range that does not threaten damage to the helix, i.e., to a time interval range in which an alarm signal is not supplied.

6 Claims, 2 Drawing Sheets

MICROWAVE TUBE SYSTEM AND MICROWAVE TUBE

BACKGROUND OF THE INVENTION

1. Field of the Invention

The present invention relates to a microwave tube such as a klystron or traveling-wave tube that is used in the amplification and oscillation of a high-frequency signal, and to a microwave tube system that is provided with a power supply device for supplying a prescribed power supply voltage to each electrode of the microwave tube.

2. Description of the Related Art

A microwave tube such as a klystron or a traveling-wave tube is an electron tube that realizes the amplification and oscillation of a high-frequency signal through the interaction between a high-frequency circuit and an electron beam that is emitted from an electron gun. As shown in FIG. 1, such a microwave tube is a construction that includes: electron gun 10 for emitting electron beam 50; helix 20, which is a high-frequency circuit for causing interaction between electron beam 50 that is emitted from electron gun 10 and a high-frequency signal (microwave or millimeter wave); collector electrode 30 for capturing electron beam 50 that is supplied from helix 20; and anode electrode 40 for guiding electron beam 50 that is emitted from electron gun 10 through helix 20.

Electron gun 10 is equipped with: cathode electrode 11 for emitting thermions; heater 12 for supplying thermal energy for causing cathode electrode 11 to emit thermions; and Wehnelt electrode 13 for focusing thermions to form electron beam 50.

A prescribed power supply voltage from power supply device 60 is supplied to collector electrode 30 and electron gun 10 of microwave tube 1 that is shown in FIG. 1, and anode electrode 40 and helix 20 are each connected to the case of microwave tube 1 and thus grounded.

A common negative high voltage (cathode voltage) is supplied from power supply device 60 to Wehnelt electrode 13 and cathode electrode 11 of electron gun 10, and a prescribed voltage that takes the cathode voltage as a reference is supplied to heater 12. In addition, a positive high voltage that takes the cathode voltage as a reference is supplied to collector electrode 30.

Microwave tube 1 also includes a configuration in which the connection between anode electrode 40 and helix 20 is cut and different power supply voltages are supplied to anode electrode 40 and helix 20.

In this type of configuration, electron beam 50 that is emitted from electron gun 10 is accelerated by anode electrode 40 and introduced into helix 20, and then travels inside helix 20 while interacting with the high-frequency signal that is applied as input to helix 20. Output electron beam 50 that is supplied from helix 20 is captured by collector electrode 30. At this time, a high-frequency signal that has been amplified by interaction with electron beam 50 is supplied as output from helix 20.

However, cathode electrode 11 that is provided in electron gun 10 that is shown in FIG. 1 is typically formed of a porous tungsten substrate shaped as a disk that has been impregnated with an oxide of, for example, barium (Ba), calcium (Ca), or aluminum (Al). The oxide (impregnated material) that has been impregnated in this cathode electrode 11 is vaporized by the heat of heater 12 and adheres to Wehnelt electrode 13 and anode electrode 40.

In microwave tube 1, a high voltage of at least several KV is applied between anode electrode 40 and cathode electrode 11 during operation, and when minute protuberances are formed from the impregnated material that adheres to Wehnelt electrode 13 and anode electrode 40, an electric field concentrates at these minute protuberances and an electrical discharge is generated between Wehnelt electrode 13 and anode electrode 40.

When discharge is produced between Wehnelt electrode 13 and anode electrode 40, the form of the electric field that is formed at Wehnelt electrode 13 by the discharge current is disrupted, the path of electron beam 50 that is emitted from electron gun 10 is disturbed, and a portion of this electron beam 50 collides with anode electrode 40 or helix 20. As a result, pulse-shaped noise is generated in the high-frequency signal that is amplified in helix 20.

In addition, the collision of electrons with anode electrode 40 and helix 20 causes the flow of current between cathode electrode 11 and anode electrode 40 and between cathode electrode 11 and helix 20. At this time, the path of electron beam 50 that is disrupted by the discharge does not immediately recover, and the state in which current flows between cathode electrode 11 and anode electrode 40 and between cathode electrode 11 and helix 20 continues for at least several msec. In particular, in the configuration shown in FIG. 1 in which anode electrode 40 and helix 20 are connected, the discharge current that is generated between Wehnelt electrode 13 and anode electrode 40 and the current that is produced by the collision of electron beam 50 with anode electrode 40 and helix 20 all pass through helix 20 and are fed back to power supply device 2, raising the concern that helix 20 will be damaged by excess current (Ihel excess current).

When the form of the electric field that forms at Wehnelt electrode 13 is disrupted by the discharge current, moreover, the diameter of electron beam 50 fluctuates inside helix 20 and irregularities occur in the interaction with the high-frequency signal, leading to variations such as increase in the power consumption and decrease in the amplification performance of microwave tube 1.

As one example of a configuration for dealing with this problem, Japanese Patent Laid-Open Publication No. 301342/1992 (hereinbelow referred to as “Patent Document 1”) proposes a configuration in which an inductance element is serially inserted in the lead line that connects anode electrode and power supply device to suppress discharge that is produced between anode electrode and cathode electrode.

However, the microwave tube that is described in the above-described Patent Document 1 is a configuration in which different power supply voltages are applied to the anode electrode and the helix, and this configuration therefore cannot be easily applied to the configuration shown in FIG. 1 in which the same voltage is applied to anode electrode 40 and helix 20. Even if an inductance element were used, its inductance value is extremely high (Patent Document 1 provides an example of using 24 Henries [H]), and moreover, an inductance element has both large cubic volume and weight and therefore cannot be applied to systems that require compact size and light weight.

The discharge that is produced between Wehnelt electrode 13 and anode electrode 40 of above-described microwave tube 1 can be reduced by the method that is proposed in Patent Document 1 or by modifying the configuration of microwave tube 1, but this discharge is difficult to completely eliminate.

Thus, in a microwave tube system of the prior art, power supply device 60 is provided with Ihel excess current detection circuit 61 for detecting excess current of helix 20 that flows as a result of the discharge between Wehnelt electrode 13 and anode electrode 40 by observing the current that flows between helix 20 and cathode electrode 11 as shown in FIG. 1. Ihel excess current detection circuit 61 supplies alarm signal (Ihel ALARM) output when an excess current that threatens to damage helix 20 flows continuously for a prescribed interval of time or more, and power supply device 60, upon detecting the alarm signal, halts the supply of power to microwave tube 1.

However, microwave tubes 1 are used in, for example, the transmission devices of, for example, satellite communication systems or satellite broadcasting systems in which repair or exchange is difficult, and as a result, in many cases the operation of microwave tube 1 cannot be easily halted despite the output of an alarm signal from the above-described Ihel excess current detection circuit 61. On the other hand, discharge that is produced between Wehnelt electrode 13 and anode electrode 40 may shorten the operating life of microwave tube 1 due to damage to helix 20 caused by excess current or by drops in the insulative capacity between electrodes, and moreover, may bring about system halts due to damage to devices or drops in system performance due to the occurrence of noise. Thus, the protective functions of a microwave tube that employs the above-described alarm signal (Ihel ALARM) cannot be eliminated.

Accordingly, a microwave tube is preferably used while detecting discharge between Wehnelt electrode 13 and anode electrode 40 such that an alarm signal is generated only when discharge is generated frequently or when a large discharge current flows, and not when discharge is produced only infrequently.

SUMMARY OF THE INVENTION

It is an object of the present invention to provide a microwave tube system and microwave tube in which the easy output of an alarm signal is suppressed to allow prevention of unnecessary halts of operation.

To achieve the above-described object, the present invention has a configuration in which the connection between the anode electrode and the helix is cut, the helix is grounded, and that is provided with a current suppression element between the anode electrode and ground voltage for suppressing the continuous time interval of flow of excess current to the helix that is caused by discharge to a time interval range in which an alarm signal is not supplied as output in the power supply device, i.e., a time interval range in which damage to the helix is not likely.

When, for example, a discharge occurs between the Wehnelt electrode and anode electrode in this type of configuration, not only does a discharge current flow between the cathode electrode and anode electrode, but an excess current resulting from this discharge that flows to the helix is also fed back to the power supply device. At this time, the drop in voltage that is caused by the current suppression element brings about a drop in the voltage of the anode electrode (to approach the voltage of the cathode electrode), and when the voltage of the anode electrode is sufficiently close to the voltage of the cathode electrode (which equals the voltage of the Wehnelt electrode), discharge that is generated between the Wehnelt electrode and the anode electrode is halted. As a result, the discharge current that flows between the cathode electrode and anode electrode is blocked, and the excess current that flows to the helix is also blocked.

Accordingly, the provision of a current suppression element can shorten the continuous interval of time of flow of an excess current to the helix that is caused by discharge, and thus can prevent shortening of the operating life of the microwave tube that results from damage to the helix caused by the flow of excess current and a decrease in the insulative capacity between electrodes. The provision of the current suppression element can also suppress the easy output of alarm signals resulting from discharges that occur in the microwave tube, and thus can prevent unnecessary operation halts of the microwave tube system.

In particular, if a resistor is used as the current suppression element, the mere addition of this relatively small part can suppress the continuous time interval of flow of an excess current to the helix that is caused by discharge, and can therefore limit increase in the bulk and weight of the microwave tube.

The above and other objects, features, and advantages of the present invention will become apparent from the following description with reference to the accompanying drawing which illustrate example of the present invention.

DETAILED DESCRIPTION OF THE PREFERRED EMBODIMENTS

Explanation next regards the present invention with reference to the accompanying figures.

Figure 1:
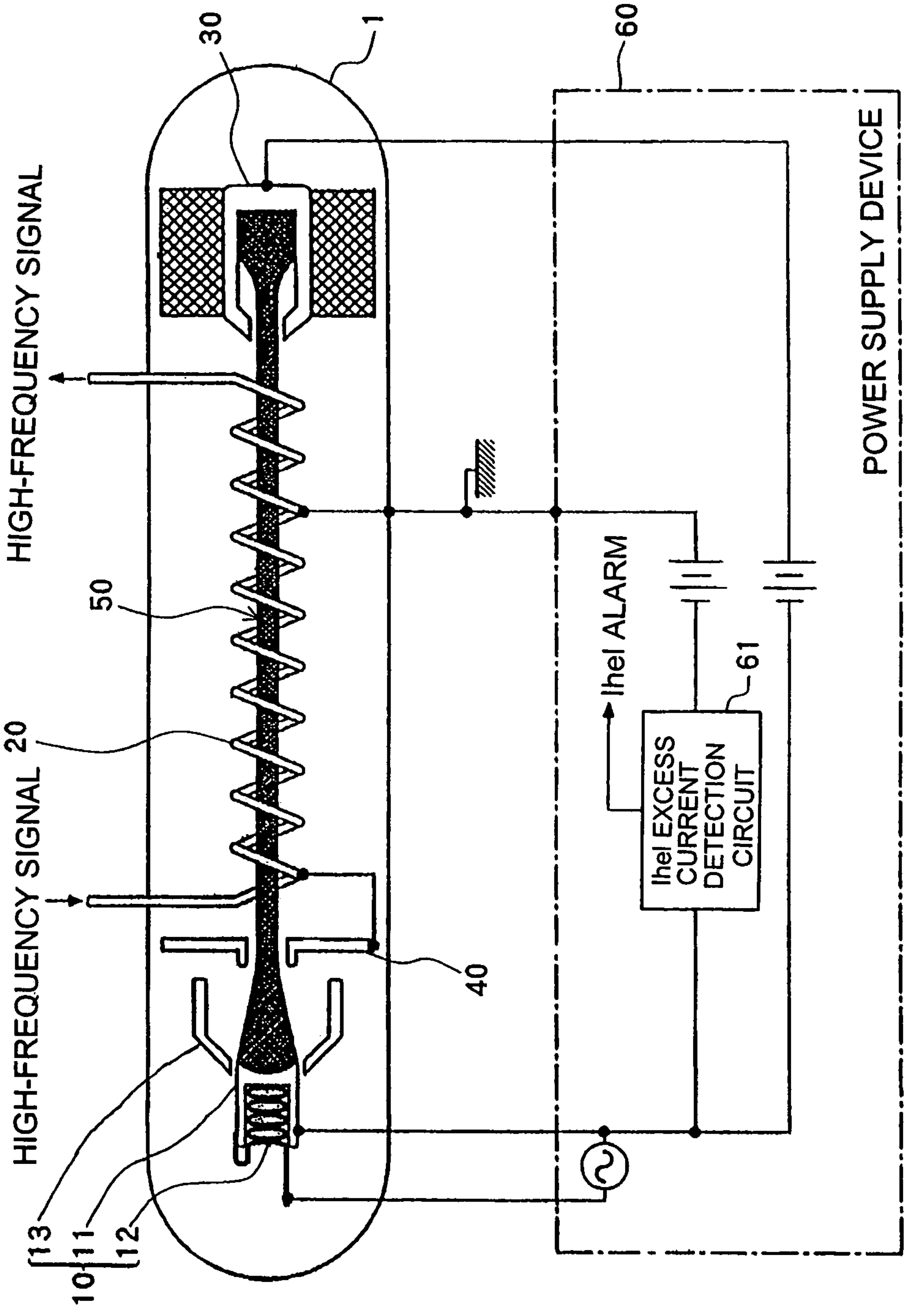
Fig. 1 (prior art)
FIG. 1 is a schematic view of the configuration of a microwave tube system of the prior art.
Figure 2:
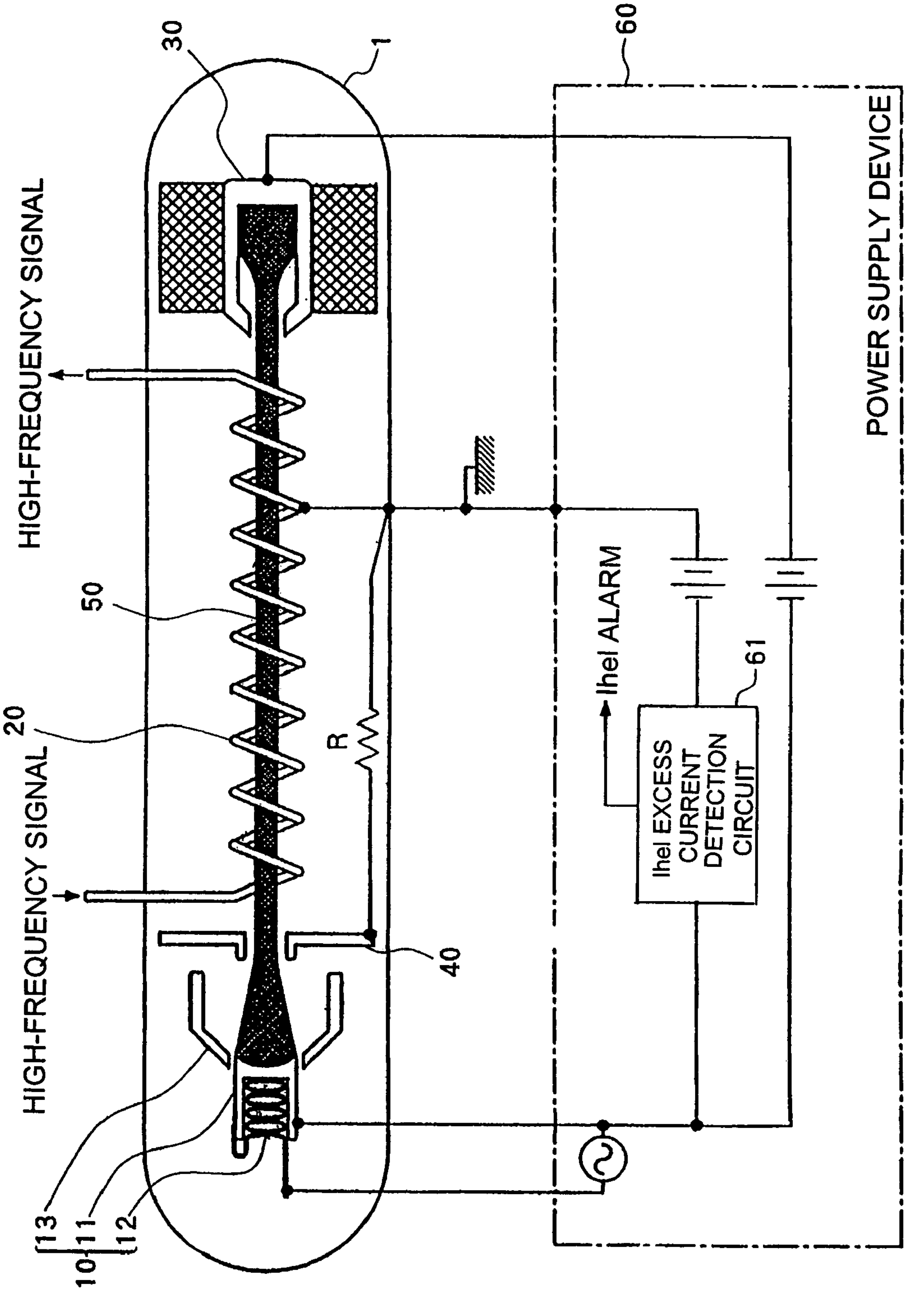
FIG. 2 is a schematic view of an example of the configuration of a microwave tube system of the present invention.

As shown in FIG. 2, the microwave tube of the present invention is a configuration in which the connection between anode electrode 40 and helix 20 of microwave tube 1 of the prior art shown in FIG. 1 is cut off, helix 20 is connected to the case of microwave tube 1 and thus grounded, and a current suppression element is inserted between anode electrode 40 and the case (ground voltage) of microwave tube 1.

A component such as resistor R is used as current suppression element, and this resistor R is accommodated inside the case of microwave tube 1. Common lead lines that are used for supplying the same voltage to anode electrode 40 and helix 20 are lead out from microwave tube 1. The configuration of microwave tube 1 and power supply device 60 is otherwise identical to that of the microwave tube system of the prior art that is shown in FIG. 1, and explanation of this configuration is therefore here omitted. The constituent elements of microwave tube 1 and power supply device 60 shown in FIG. 2 are each given the same reference numerals as respective constituent elements of microwave tube 1 and power supply device 60 that are shown in FIG. 1.

When a discharge occurs between Wehnelt electrode 13 and anode electrode 40 in microwave tube 1 of the present invention, the discharge current that flows between cathode electrode 11 and anode electrode 40 and the excess current that flows to helix 20 as a result of this discharge are fed back to power supply device 60. At this time, the voltage drop that occurs due to the flow of current in resistor R results in a drop in the voltage of anode electrode 40 (to approach the voltage of cathode electrode 11), and when the voltage of anode electrode 40 is sufficiently close to the voltage of cathode electrode 11 (which equals the voltage of Wehnelt electrode 13), the discharge that occurs between Wehnelt electrode 13 and anode electrode 40 is halted. As a result, not only is the discharge current that flows between cathode electrode 11 and anode electrode 40 blocked, but the excess current that flows to helix 20 is also blocked.

In the configuration of microwave tube 1 of the prior art that is shown in FIG. 1, the discharge current that flows between Wehnelt electrode 13 and anode electrode 40 normally has a time range on the order of several tens of μsec. The excess current of helix 20 that is brought about by discharge flows continuously for several msec or more. As a result, Ihel excess current detection circuit 61 that is provided in power supply device 60 is normally adjusted so as to supply alarm signal output upon detecting an Ihel excess current having a time range on the order of several msec such that damage to helix 20 will not occur.

In the microwave tube system of the present invention, the continuous time interval of excess current that flows in helix 20 that occurs due to discharge between Wehnelt electrode 13 and anode electrode 40 is set by optimally selecting the resistance of resistor R to several tens of μsec, i.e., approximately equal to the discharge time, whereby an alarm signal (Ihel ALARM) is not supplied as output despite the occurrence of discharge between cathode electrode 11 and anode electrode 40.

The resistance of resistor R in this case is on the order of several MΩ, and, because the time range of the flow of excess current is several tens of μsec, which is approximately equal to the discharge time, a permissible power of resistor R of several W is adequate.

The insertion of a current suppression element between anode electrode 40 and the case (ground voltage) of microwave tube 1 according to the configuration of the present invention can therefore prevent shortening of the operating life of the microwave tube due to damage to helix 20 caused by Ihel excess current or loss of insulative capacity between electrodes. The configuration of the present invention can further suppress the easy output of alarm signals that are caused by the detection of Ihel excess current that arises due to discharge that occurs between Wehnelt electrode 13 and anode electrode 40 and can therefore prevent unnecessary operation halts of the microwave tube system.

In addition, if resistor R is used as the current suppression element, the mere addition of this comparatively small component (resistor R) can make the continuous time interval of excess current that flows to the helix as a result of a discharge shorter than the range of the time interval in which the above-described alarm signal is supplied, and can therefore suppress increase in the bulk and weight of the microwave tube.

When there is no particular limit on the size or weight of the microwave tube system, anode electrode 40 and the case of microwave tube 1 may be connected by an inductance element as current suppression element in place of the above-described resistor R. In this case as well, if the value of the inductance element is optimally selected such that the continuous time interval of Ihel excess current is approximately equal to the discharge time (several tens of μsec), the same effect can be obtained as when using the above-described resistor R.

While preferred embodiments of the present invention have been described using specific terms, such description is for illustrative purposes only, and it is to be understood that changes and variations may be made without departing from the spirit or scope of the following claims.

What is claimed is:

1. A microwave tube system, comprising:

a microwave tube that is provided with a helix that is grounded and a current suppression element that is inserted between an anode electrode and ground voltage for suppressing a continuous time interval of flow of excess current to said helix that is caused by discharge to a time interval range that is shorter than a prescribed time interval that would threaten damage to the helix; and a power supply device for supplying a prescribed power supply voltage to each electrode of said microwave tube, said power supply device being provided with an excess current detection circuit for supplying an alarm signal when the continuous time interval of flow of excess current to said helix is equal to or greater than a prescribed time interval that would threaten damage to said helix.

2. The microwave tube system according to claim 1, wherein said microwave tube:

incorporates said current suppression element; and is provided with a common lead line that is used for supplying the same voltage to said anode electrode and said helix.

3. The microwave tube system according to claim 1, wherein said current suppression element is a resistor.

4. A microwave tube, comprising:

a helix that is grounded; and a current suppression element that is inserted between an anode electrode and ground voltage for suppressing a continuous time interval of flow of an excess current to said helix that is caused by discharge to a time interval range that is shorter than a prescribed time interval that would threaten damage to said helix.

5. The microwave tube according to claim 4, further provided with common lead lines that are used for supplying the same voltage to said anode electrode and said helix.

6. The microwave tube according to claim 4, wherein said current suppression element is a resistor.

* * * * *